(12) United States Patent
In et al.

(10) Patent No.: US 9,248,633 B2
(45) Date of Patent: Feb. 2, 2016

(54) DISPLAY APPARATUS AND HOT STAMPING SYSTEM FOR THE SAME

(71) Applicant: SAMSUNG ELECTRONICS CO., LTD., Suwon-si (KR)

(72) Inventors: Woo Sung In, Hwaseong-si (KR); Kyung Hwan Kim, Yongin-si (KR); Young Jik Lee, Seongnam-si (KR); Kyu Hong Jung, Suwon-si (KR); Suk Ju Yoon, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 302 days.

(21) Appl. No.: 13/856,100

(22) Filed: Apr. 3, 2013

(65) Prior Publication Data

US 2013/0279094 A1 Oct. 24, 2013

Related U.S. Application Data

(60) Provisional application No. 61/636,043, filed on Apr. 20, 2012.

(30) Foreign Application Priority Data

May 18, 2012 (KR) ........................ 10-2012-0052844

(51) Int. Cl.
| | |
|---|---|
| *H05K 5/00* | (2006.01) |
| *B32B 37/10* | (2006.01) |
| *H05K 5/03* | (2006.01) |
| *B29C 63/00* | (2006.01) |
| *B29L 12/00* | (2006.01) |
| *B29L 31/34* | (2006.01) |

(52) U.S. Cl.
CPC ............. *B32B 37/10* (2013.01); *B29C 63/0026* (2013.01); *H05K 5/0017* (2013.01); *H05K 5/03* (2013.01); *B29L 2012/00* (2013.01); *B29L 2031/3475* (2013.01); *B32B 2457/20* (2013.01)

(58) Field of Classification Search
CPC combination set(s) only.
See application file for complete search history.

(56) References Cited

U.S. PATENT DOCUMENTS

| | | | |
|---|---|---|---|
| 5,002,184 A | * | 3/1991 | Lloyd ........................... 206/305 |
| 5,115,737 A | | 5/1992 | Amendola |
| 5,812,188 A | * | 9/1998 | Adair .............................. 348/77 |

(Continued)

FOREIGN PATENT DOCUMENTS

| | | |
|---|---|---|
| JP | 8-150766 A | 6/1996 |
| JP | 11-115298 A | 4/1999 |
| KR | 10-2008-0040310 A | 5/2008 |

OTHER PUBLICATIONS

Communication dated Jun. 27, 2013 issued by the International Searching Authority in counterpart International Application No. PCT/KR2013/002772 (PCT/ISA/210).

*Primary Examiner* — Lisa Lea Edmonds
(74) *Attorney, Agent, or Firm* — Sughrue Mion, PLLC

(57) ABSTRACT

Disclosed are a display apparatus including a display panel on which an image is displayed, a cover including a side portion configured to cover upper and lower side surfaces and left and right side surfaces of the display panel and a rear portion configured to cover an outer peripheral region of a rear surface of the display panel, and a rear cover coupled to the middle cover and configured to cover the rear surface of the display panel, and a hot stamping system for the same. A thin film having a particular color is attached to the side portion via the hot stamping system, which enables easy manufacture of the display apparatus having various colors of covers.

10 Claims, 11 Drawing Sheets

(56) References Cited

U.S. PATENT DOCUMENTS

| | | | |
|---|---|---|---|
| 5,835,344 A * | 11/1998 | Alexander | 361/679.46 |
| 5,931,297 A * | 8/1999 | Weill et al. | 206/320 |
| 6,229,697 B1 * | 5/2001 | Selker | 361/679.09 |
| 6,267,236 B1 * | 7/2001 | Seok | 206/320 |
| 6,273,252 B1 * | 8/2001 | Mitchell | 206/320 |
| 6,471,056 B1 * | 10/2002 | Tzeng | 206/320 |
| 6,659,274 B2 * | 12/2003 | Enners | 206/305 |
| 6,980,777 B2 * | 12/2005 | Shepherd et al. | 455/90.3 |
| 7,016,184 B1 * | 3/2006 | Oneyama et al. | 361/679.27 |
| 7,237,319 B2 | 7/2007 | Kasahara et al. | |
| 7,443,566 B2 * | 10/2008 | Lerenius et al. | 359/265 |
| 7,561,415 B2 * | 7/2009 | Liou et al. | 361/679.26 |
| 7,826,219 B2 * | 11/2010 | Chien et al. | 361/679.55 |
| 8,416,568 B2 * | 4/2013 | Tian et al. | 361/679.55 |
| 8,724,300 B2 * | 5/2014 | Smith et al. | 361/679.01 |
| 2004/0231138 A1 | 11/2004 | Kasahara et al. | |
| 2006/0124482 A1 * | 6/2006 | Hodges | 206/320 |
| 2007/0008684 A1 * | 1/2007 | Anderson et al. | 361/681 |
| 2008/0074833 A1 * | 3/2008 | Chien et al. | 361/683 |
| 2008/0074834 A1 * | 3/2008 | Chien et al. | 361/683 |
| 2010/0002377 A1 * | 1/2010 | Kim | 361/679.55 |
| 2010/0046162 A1 * | 2/2010 | Chen et al. | 361/679.55 |
| 2011/0037726 A1 * | 2/2011 | Lee | 345/174 |
| 2012/0028679 A1 * | 2/2012 | Ozasa | 455/556.1 |
| 2012/0087072 A1 * | 4/2012 | McGuire et al. | 361/679.01 |

\* cited by examiner

DISPLAY APPARATUS AND HOT STAMPING SYSTEM FOR THE SAME

CROSS-REFERENCE TO RELATED APPLICATIONS

This application claims the benefit of Korean Patent Application No. 10-2012-0052844, filed on May 18, 2012 in the Korean Intellectual Property Office and U.S. Provisional Patent Application No. 61/636,043, filed on Apr. 20, 2012, the disclosures of which are incorporated herein by reference.

BACKGROUND

1. Field

Exemplary embodiments consistent with the invention relate to a display apparatus and a hot stamping system to attach a thin-film sheet to the display apparatus via hot stamping.

2. Description of the Related Art

In general, a display apparatus includes a display panel on which an image is displayed, and examples thereof include a liquid-crystal panel, Plasma Display Panel (PDP), etc.

A typical display apparatus includes a display panel on which an image is formed, and a cover configured to cover the side and rear surfaces of the display panel, for example.

With the recent advances in high-quality display apparatuses, providing the display apparatuses with covers in various colors to satisfy various consumer demands may be desirable for the increasingly important design aspects of display apparatuses.

The covers are generally formed of resins, and therefore it may be necessary to use various colors of resins corresponding to the aforementioned various colors.

SUMMARY

It is an aspect of the exemplary embodiments to provide a display apparatus in which a thin-film sheet is attached to a side portion of a cover, and a hot stamping system to attach the thin-film sheet to a side portion of the display apparatus.

Additional aspects of the invention will be set forth in part in the description which follows and, in part, will be obvious from the description, or may be learned by practice of the invention.

In accordance with one aspect of the invention, a display apparatus includes a display panel on which an image is displayed, a cover including a side portion configured to cover upper and lower side surfaces and left and right side surfaces of the display panel, and a thin film attached to an outer surface of the side portion.

The cover may include a middle cover having the side portion and a rear portion configured to cover an outer peripheral region of a rear surface of the display panel, and a rear cover coupled to the middle cover and configured to cover the rear surface of the display panel.

The side portion may be formed of a transparent material, and the rear portion may be formed of an opaque material.

The side portion and the rear portion may be integrally formed with each other via double injection molding.

The thin film may be attached to the outer surface of the side portion via hot stamping.

The side portion may include a concavely stepped portion on at least one of a front end and a rear end of the outer surface thereof to limit an attachment area of the thin film.

In accordance with another aspect of the exemplary embodiments, a hot stamping system includes a jig device to support a cover of a display apparatus, a sheet feed device disposed at one side of the jig device to feed a sheet, to which a thin film has been attached, to the upper side of the jig device, a sheet recovery device disposed at the other side of the jig device to collect the used sheet, and a hot stamping device movably disposed above the jig device to allow the thin film of the sheet to be attached to at least one side portion of the cover by applying heat and pressure to the sheet against the side portion.

The at least one side portion may include four side portions, and the jig device may be rotatably installed such that any one of the four side portions of the cover is selectively arranged above the rotated jig device.

The jig device may be vertically movably installed to allow each of the four side portions to be arranged above the jig device at the same height.

At least one of the sheet feed device and the sheet recovery device may apply a constant tension to the sheet to keep the sheet taut.

The hot stamping device may include a heater to press the sheet against the side portion, and a heater to heat the roller.

The heater may include a halogen lamp.

The hot stamping device may be movably installed in a longitudinal direction of the side portion and may attach the thin film of the sheet to the side portion.

The hot stamping device may be vertically movably installed to respond change in the height of the side portion.

The hot stamping device may be vertically moved to allow the roller to be moved to a position lower than the side portion located at the upper side thereof.

The roller may be arranged parallel to an upper surface of the side portion that is located at the upper side thereof.

The hot stamping system may further include a transport device installed above the hot stamping device to guide movement of the hot stamping device including vertical movement.

In another exemplary embodiment, there is a display apparatus including: a display panel on which an image is displayed, the display panel including an upper side surface, a lower side surface, a left side surface, and a right side surface; a cover including a side portion configured to cover the upper and the lower side surfaces and the left and the right side surfaces of the display panel; and a thin film attached to an outer surface of the side portion.

In yet another exemplary embodiment, there is hot stamping system including a jig device to support a cover of a display apparatus, the jig device including an upper side; a sheet feed device disposed at one side of the jig device to feed a sheet to which a thin film has been attached, to the upper side of the jig device sheet recovery device disposed at another side of the jig device to collect the sheet that has been used; and a hot stamping device movably disposed above the jig device, the hot stamping device applying heat and pressure to the sheet against a side portion of the cover so the thin film of the sheet is attached to the side portion.

In another exemplary embodiment, there is a display apparatus including: a display panel on which an image is displayed, the display panel including an upper surface, a lower surface, a left surface, and a right surface; a rear housing disposed behind the display panel; and a bezel which is disposed around the display panel, the bezel including a side wall which covers at least a portion of at least one from among the upper, the lower, the left, and the right surfaces of the display panel, wherein a thin film is attached to an outer surface of the side wall and the side wall is of one color and the thin film is of another color.

The bezel may be a front bezel and the front bezel further includes a front plate disposed in front of the display panel, and the side wall extends rearwardly from the front plate.

BRIEF DESCRIPTION OF THE DRAWINGS

These and/or other aspects of the exemplary embodiments will become apparent and more readily appreciated from the following, taken in conjunction with the accompanying drawings of which.

DETAILED DESCRIPTION

Figure 1:
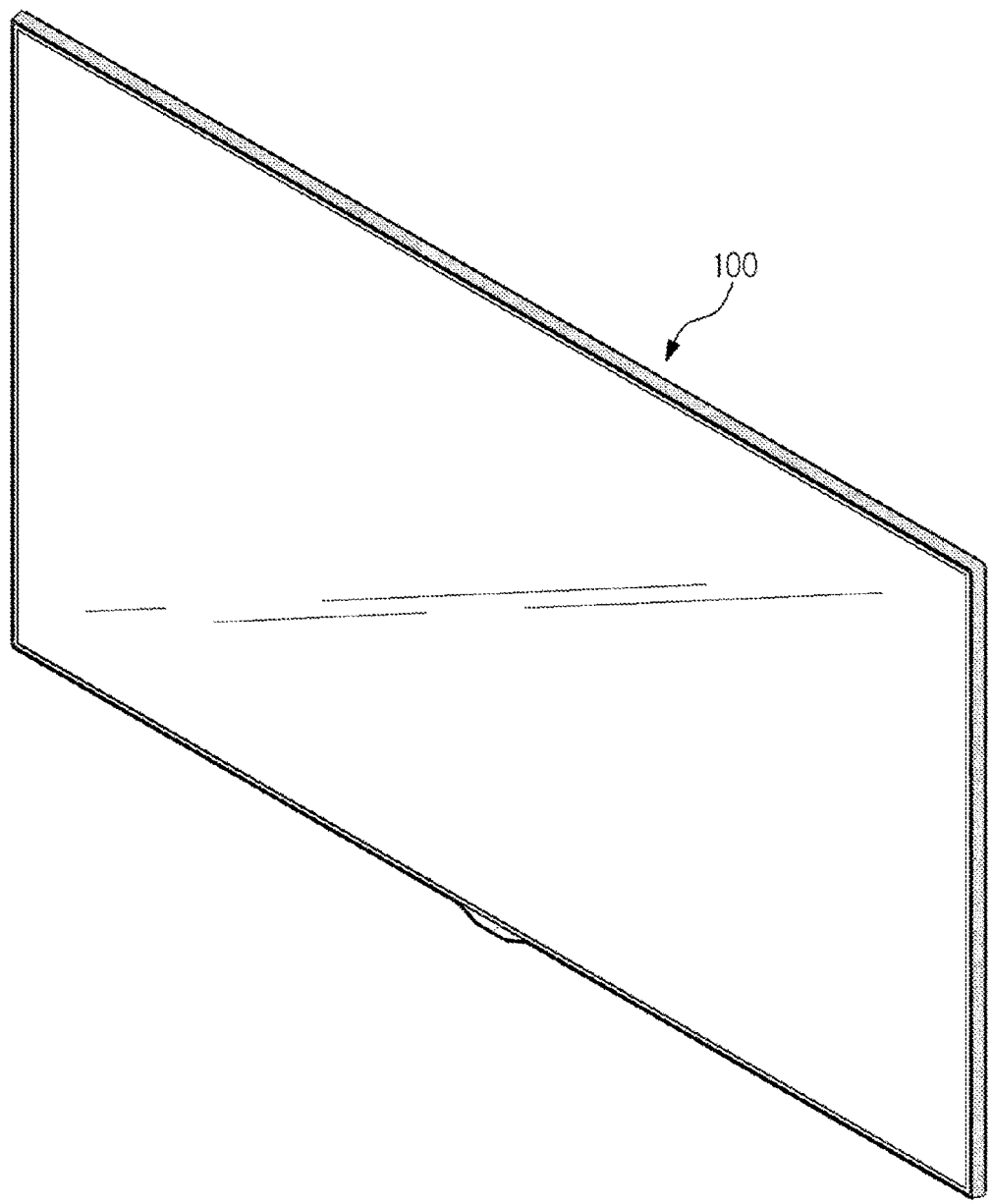
FIG. 1 is a perspective view illustrating a display apparatus according to an exemplary embodiment.

Reference will now be made in detail to embodiments of the exemplary embodiments, examples of which are illustrated in the accompanying drawings, wherein like reference numerals refer to like elements throughout.

An aspect of the exemplary embodiment provides a display apparatus in which a hot stamping process may be applied to a cover, and a hot stamping system for the same.

Hereinafter, the cover of the display apparatus and the hot stamping system to apply a hot stamping process to the cover according to an exemplary embodiment will be described.

Figure 2:
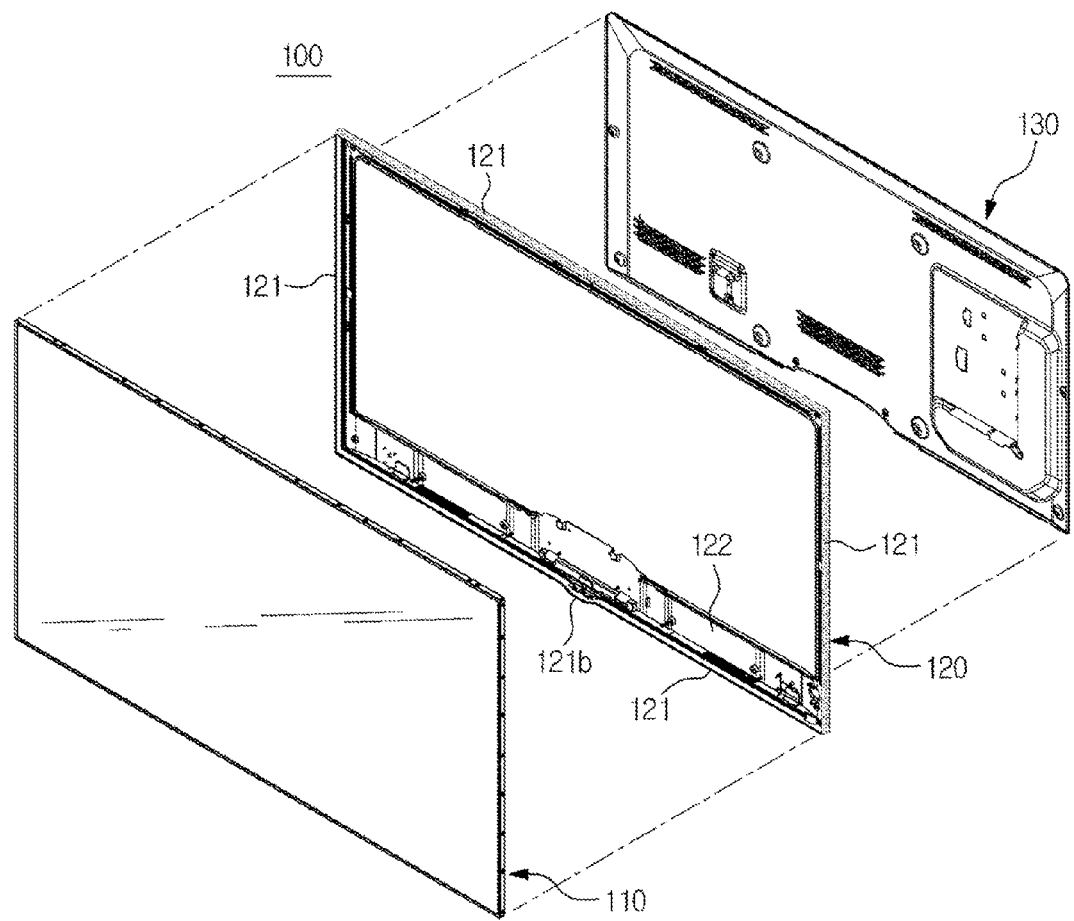
FIG. 2 is an exploded perspective view illustrating the display apparatus according to the exemplary embodiment.

As illustrated in FIGS. 1 and 2, the display apparatus, designated by reference numeral 100, according to the exemplary embodiment includes a display panel 110 on which an image is displayed, and covers configured to cover upper and lower surfaces and left and right surfaces as well as a rear surface of the display panel 110.

The covers include a middle cover 120 and a rear cover 130. The middle cover 120 includes four side portions 121 configured to cover four side surfaces, i.e. upper and lower side surfaces and left and right side surfaces of the display panel 110, and a rear portion 122 configured to cover an outer peripheral region of the rear surface of the display panel 110. The rear cover 130 is installed to the middle cover 120 and is configured to cover a central region of the rear surface of the display panel 110. The rear cover 130 defines a space in which elements, such as a circuit board to control the display panel 110, etc., are accommodated.

In another exemplary embodiment, the covers may include a bezel which covers the sides of the display panel 110 through side walls of the bezel or a front bezel which includes a front plate which is disposed in front of the display panel 110 and side walls extending rearwardly from the front place, which cover the sides of the display panel 110.

The side portions 121 of the middle cover 120 are formed of a transparent material to enable realization of various colors. The rear portion 122 is formed of an opaque material to cover and hide the outer peripheral region of the rear surface of the display panel 110. In the present embodiment, the middle cover 120 is formed by double injection molding such that the opaque rear portion 122 and the transparent side portions 121 are integrally formed with each other.

Figure 3:
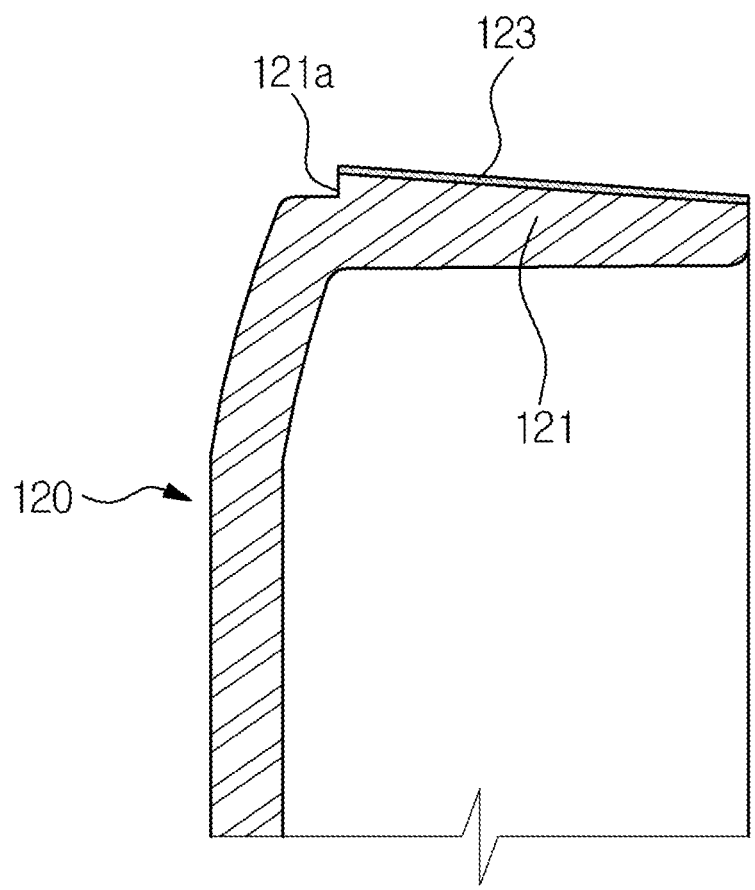
FIG. 3 is a sectional view illustrating a middle cover of the display apparatus according to the exemplary embodiment.

Additionally, a thin film 123 which is illustrated in FIG. 3 and has a particular color, may be attached to the transparent side portions 121 via a hot stamping system 200 (FIG. 4) that will be described hereinafter, to impose the particular color on the side portions 121. That is, changing the side portions 121 to various colors may be easily accomplished by changing the color of the thin film 123 to the side portions 121.

In another exemplary embodiment, the thin film 123 may be attached to the side wall of a bezel which is disposed around the display panel 110.

Figure 4:
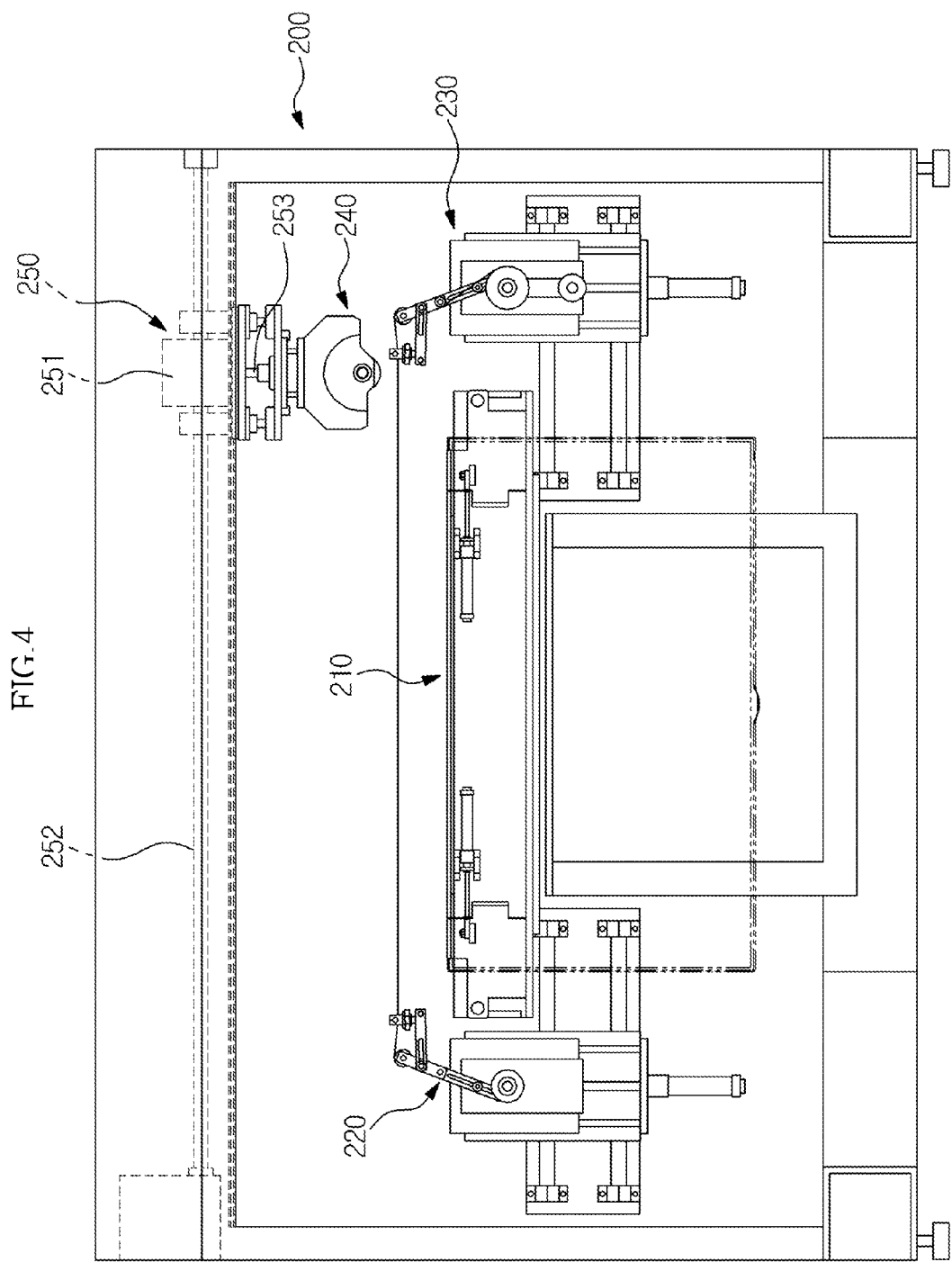
FIG. 4 is a schematic view illustrating a hot stamping system for hot stamping of the middle cover of the display apparatus according to an exemplary embodiment.

The side portions 121 may optionally have a linear or curvilinear outer surface based on the design of the display apparatus 100, and may have a linear cross section to enable implementation of hot stamping via a roller 241 of a hot stamping device 240 that will be described hereinafter (FIG. 4). In the present exemplary embodiment, the outer surface of the side portions 121 is an oblique surface that is gradually raised from the front side to the rear side. In the present exemplary embodiment, the outer surface of the side portions 121 has an inclination angle of 8.9195 degrees with respect to a horizontal plane. Four corners of the side portions 121 are rounded for an aesthetically pleasant design.

A rear end of the outer surface of the side portions 121 has a concavely stepped portion 121a for accurate division of a hot stamping region where the thin film 123 is attached via hot stamping by the hot stamping device 240 that will be described hereinafter. In the present exemplary embodiment, the stepped portion 121a is concavely formed only at the rear end of the outer surface of the side portions 121, but the disclosure is not limited thereto. The stepped portion 121a may also be concavely formed even at the front end as well as the rear end of the outer surface of the side portions 121.

In the present exemplary embodiment, additionally, a lower one of the side portions 121 is centrally provided with a downwardly extending protrusion 121b to create a space where, e.g., a logo may be marked.

Next, the hot stamping system to attach the thin film to the side portions of the middle cover of the display apparatus will be described.

As illustrated in FIG. 4, the hot stamping system 200 includes a center jig device 210 to grip and support the above-described middle cover 120, a sheet feed device 220 disposed at the left side of the jig device 210 to feed a sheet to which the thin film 123 has been attached, a sheet recovery device 230 disposed at the right side of the jig device 210 to collect the used sheet, and the hot stamping device 240 disposed above the jig device 210 to allow the thin film 123 on the sheet to be transferred and attached to the side portions 121 of the middle cover 120 by applying heat and pressure to the sheet.

Figure 5:
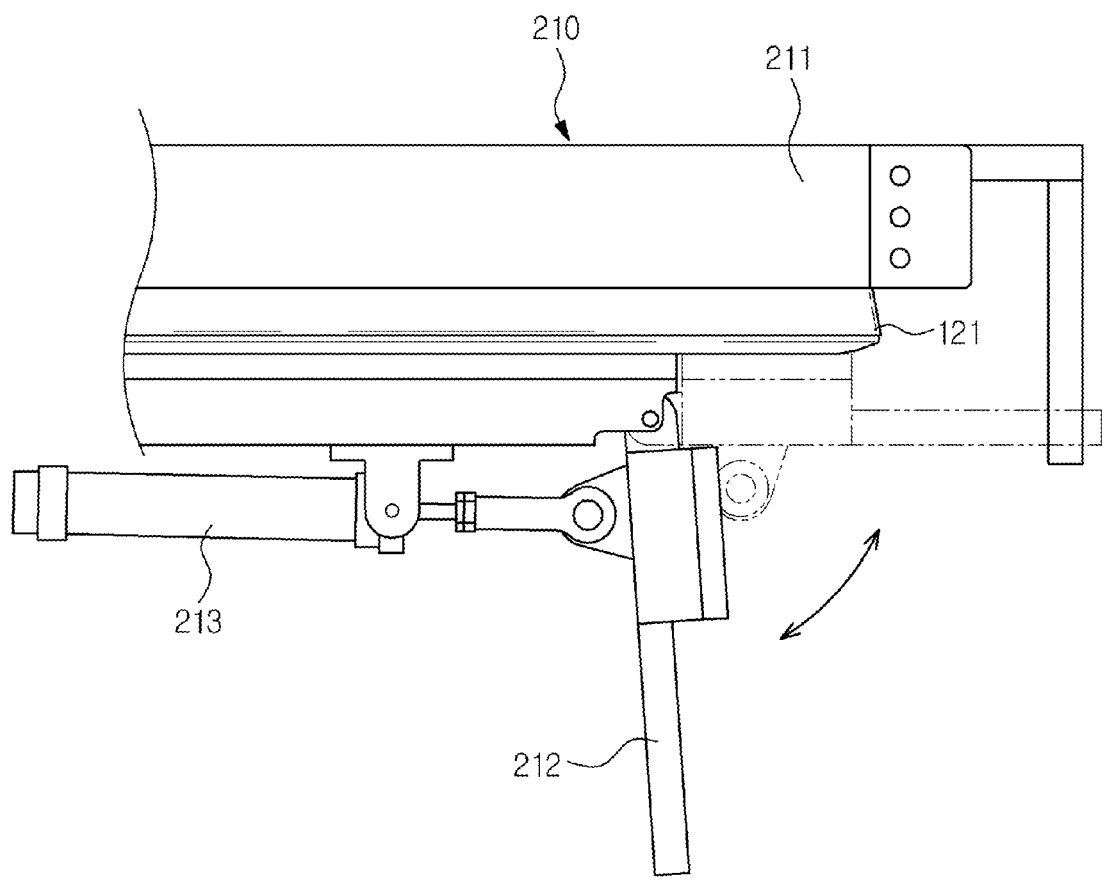
FIG. 5 is a schematic view illustrating a jig device applied to the hot stamping system according to an exemplary embodiment.

The jig device 210, as illustrated in FIG. 5 which shows a plan view of a portion of FIG. 4, supports the middle cover 120 such that one of the four side portions 121 of the middle cover 120 faces upward. The jig device 210 includes a support member 211 on which the middle cover 120 is placed, a jig member 212 to press the middle cover 120 onto the support member 211, and a gas spring 213 to elastically support the jig member 212. As such, the jig device 210 serves to prevent movement of the middle cover 120 during hot stamping, which may ensure that the thin film 123 is accurately attached to the side portions 121 of the middle cover 120.

Figure 8:
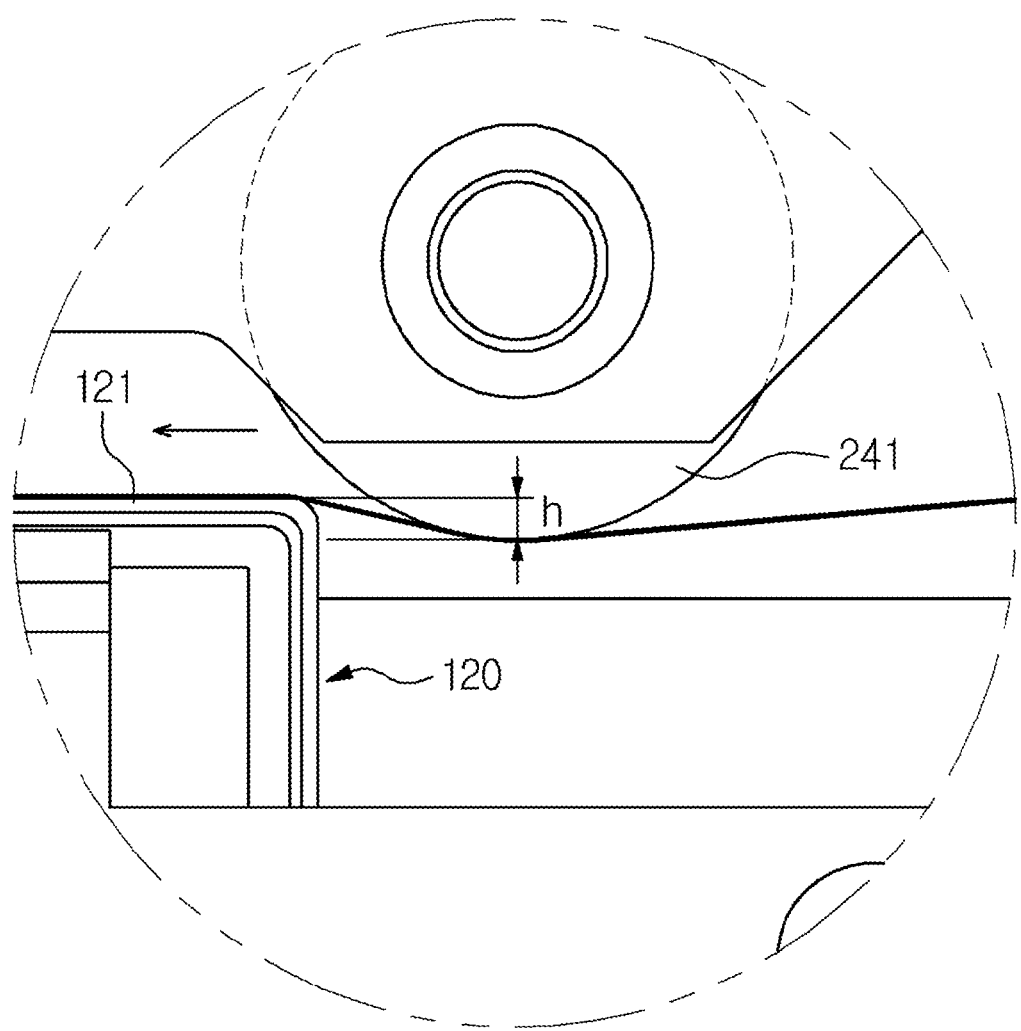
FIGS. 8 and 9 are schematic views illustrating operation of the hot stamping device applied to the hot stamping system according to the exemplary embodiment.

Referring again to FIG. 4, the sheet feed device 220 serves to feed the sheet, to which the thin film 123 has been attached, above of the jig device 210 by unwinding the sheet in the form of a roll. The sheet recovery device 230, as illustrated in FIG. 8, serves to wind and collect the sheet, which has been used for hot stamping such that at least a partial region of the thin film 123 is transferred to the side portions 121. In this case, the sheet feed device 220 applies a constant tension to the sheet to keep the sheet taut.

Figure 6:
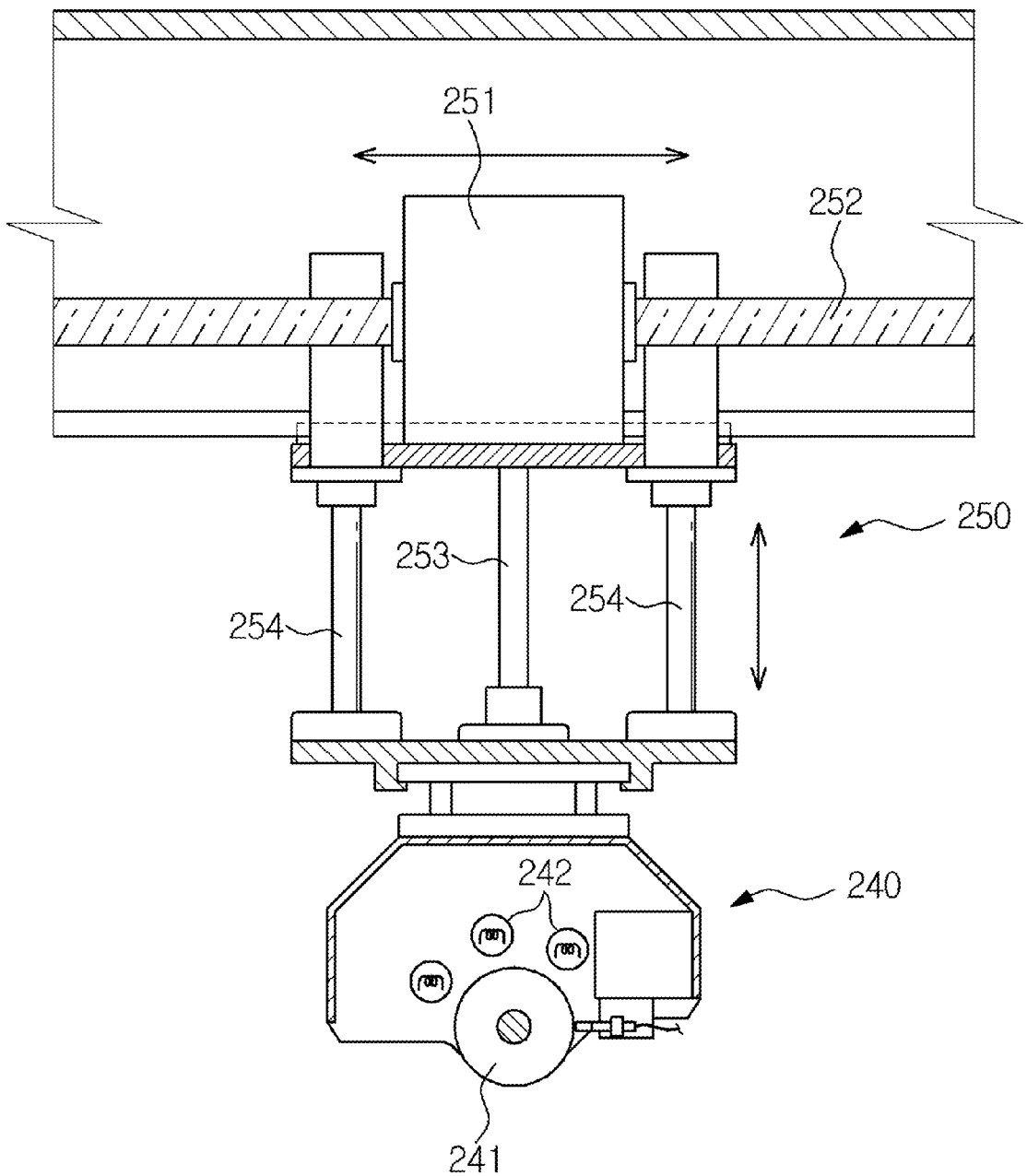
FIG. 6 is a schematic view illustrating a hot stamping device applied to the hot stamping system and a transport device to transport the hot stamping device according to an exemplary embodiment.

The hot stamping device 240, as illustrated in FIG. 6, includes a roller 241 to press the sheet against the side portions 121 of the middle cover 120, and a heater 242 to heat the roller 241. In the exemplary embodiment, the heater 242 may include a halogen lamp and may heat the roller 241 to about 200° C. In this case, an upper one of the side portions 121 has an oblique upper surface as described above. Therefore, the planar roller 241 is obliquely installed by an inclination angle corresponding to the upper surface of the side portion 121 so as to be installed parallel to the upper surface of the side portion 121. As such, when the roller 241 heated by the heater 242 presses the sheet against the upper surface of the side portion 121 of the middle cover 120, the thin film 123 on the sheet is transferred and attached to the side portion 121 of the middle cover 120 upon receiving heat and pressure via the roller 241.

The above-described hot stamping device 240 is installed to a transport device 250 provided above the hot stamping device 240 and is adapted to move along with the transport device 250 or to be vertically moved by the transport device 250. The transport device 250 includes a drive unit 251 that generates drive force, a transport screw 252 that extends in a longitudinal direction of the side portion 121 to allow the hot stamping device 240 to move in the longitudinal direction of the side portion 121, an elevating member 253 that is vertically moved by the drive unit 251 to enable vertical movement of the hot stamping device 240, and a plurality of guide bars 254 that is arranged around and parallel to the elevating member 253 to guide vertical movement of the hot stamping device 240. Although not illustrated in the drawing, the transport device 250 includes a pair of guide rails provided at opposite sides of the transport screw 252 and arranged parallel to the transport screw 252 to guide movement of the transport device 250.

Accordingly, as the hot stamping device is vertically moved by the transport device 250, the sheet is moved along the transport screw 252 and the guide rails (not shown) along with the transport device 250 while selectively pressing the side portion 121 of the middle cover 120, thereby allowing the thin film 123 of the sheet to be successively transferred to the side portion 121 from one side to the other side thereof.

A method of attaching the thin film 123 to the side portion 121 of the middle cover 120 via the hot stamping system 200 having the above-described configuration will hereinafter be described.

First, once the middle cover 120 has been placed on the support member 211, the middle cover 120 is fixed using the jig member 212 so as to be supported by the support member 211. In such a state, the roller 241 of the hot stamping device 240, as illustrated in FIG. 8, is spaced apart from the sheet and the side portion 121 of the middle cover 120.

Figure 7:
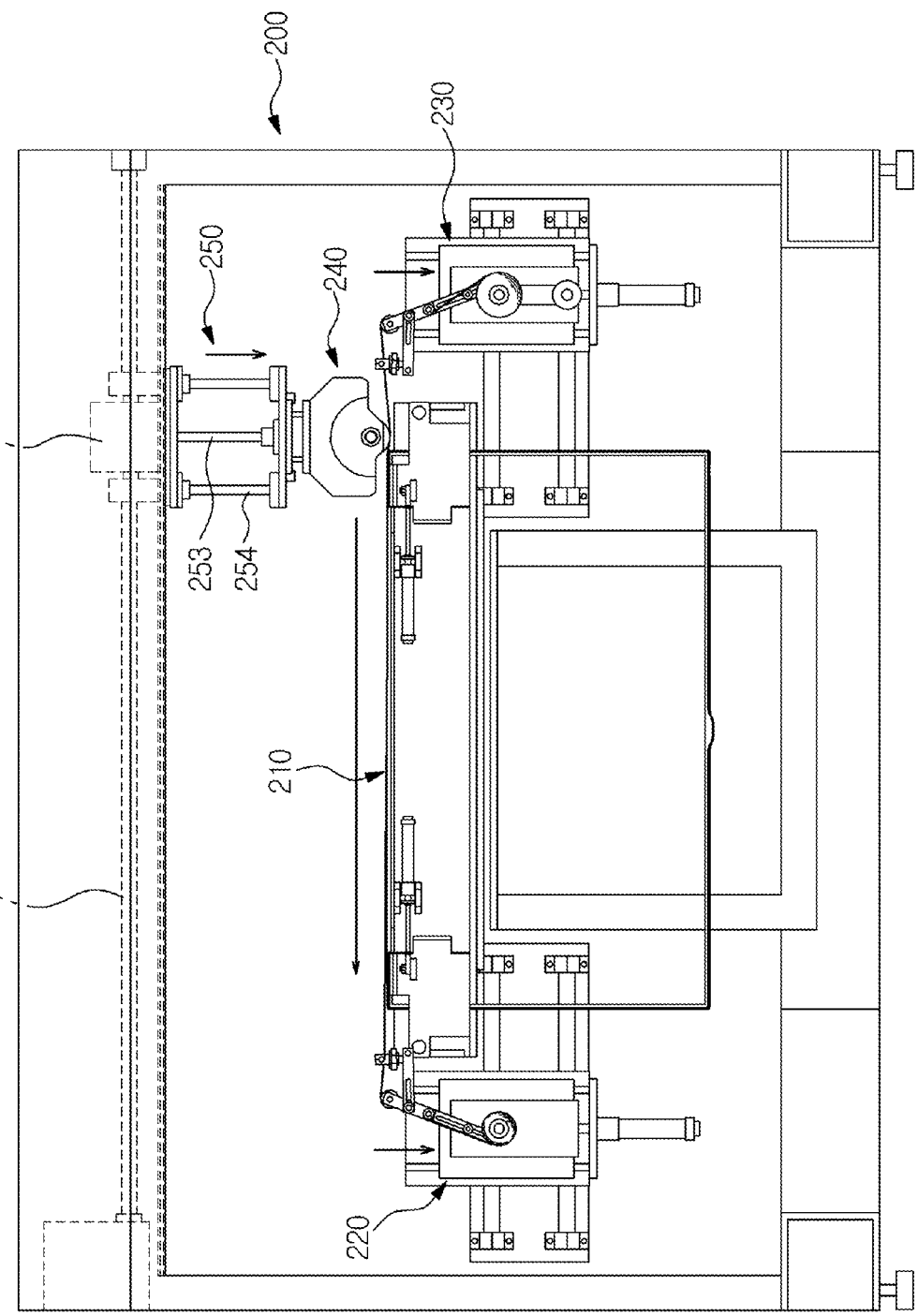
FIG. 7 is a schematic view illustrating operation of the hot stamping system according to the exemplary embodiment.

After the middle cover 120 is completely fixed, the roller 241 is heated by the heater 242 within the hot stamping device 240. After completion of heating of the roller 241, the hot stamping device 240, as illustrated in FIG. 7, is moved downward by the transport device 250, causing the roller 241 to press the sheet downward until the sheet comes into contact with the outer surface of the side portion 121. In this case, the roller 241 is moved downward and outward from the right side of the middle cover 120 as illustrated in FIG. 8, such that a lower end of the roller 241 is located at a predetermined height h that is lower than a surface of the side portion 121 where hot stamping will be performed. In this way, the thin film 123 may be transferred to one corner of the side portion 121.

Figure 9:
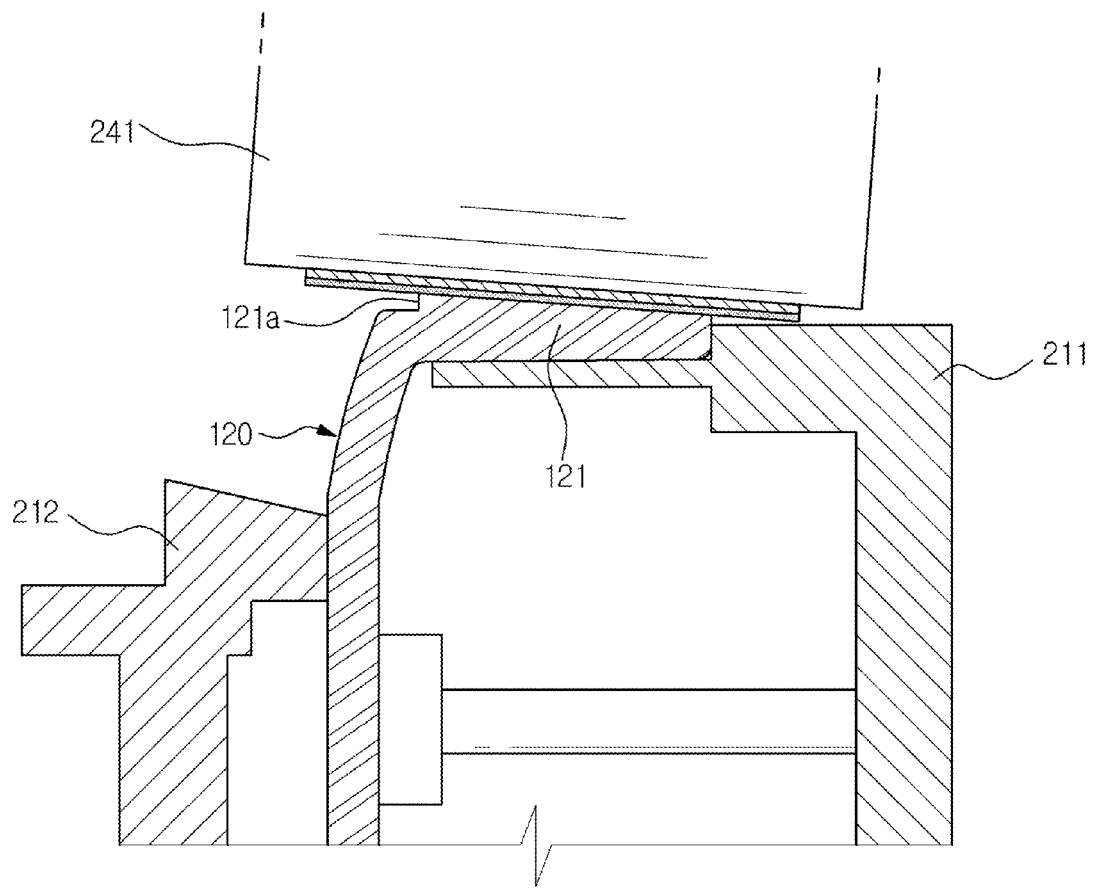

Then, the hot stamping device 240 applies heat and pressure to the thin film 123 of the sheet as illustrated in FIG. 9 while being moved along with the transport device 250 as the transport device 250 is moved along the transport screw 252, thereby allowing the thin film 123 to be successively transferred from one side to the other side of the side portion 121 so as to be attached to the side portion 121.

In this case, since the side portion 121 is obliquely formed as described above, and thus the roller 241 is also obliquely arranged, the thin film 123 on the sheet may be stably attached to the side portion 121 of the by the roller 241. Also, since the rear end of the side portion 121 has the concavely stepped portion 121a as described above, the thin film 123 may be accurately attached to the side portion 121 except for the stepped portion 121a.

Thereafter, the hot stamping device 240 is moved outward from the left side of the middle cover 120, and simultaneously is moved downward to a position lower than the side portion 121, thereby allowing the thin film 123 to be transferred and attached to an opposite corner of the side portion 121. In this way, the thin film 123 is completely attached to one side portion 121.

Since the middle cover 120 has the four side portions 121 at upper and lower sides and left and right sides thereof, the above-described operation is repeated by separating the middle cover 120 from the jig device 210 after the thin film 123 is attached to the side portion 121 as described above, and again fixing another side portion 121 to the jig device 210 so as to be placed on the jig device 210. As the above-described operation is repeated four times, the thin film 123 is completely attached to each of the four side portions 121 of the middle cover 120. In this case, the hot stamping device 240 attaches the thin film 123 so as to cover the corners of the respective side portions 121 as described above. Therefore, the corners of the side portions 121 undergo overlay of the thin film 123, which ensures more accurate attachment of the thin film 123 even to the corners.

Figure 10:
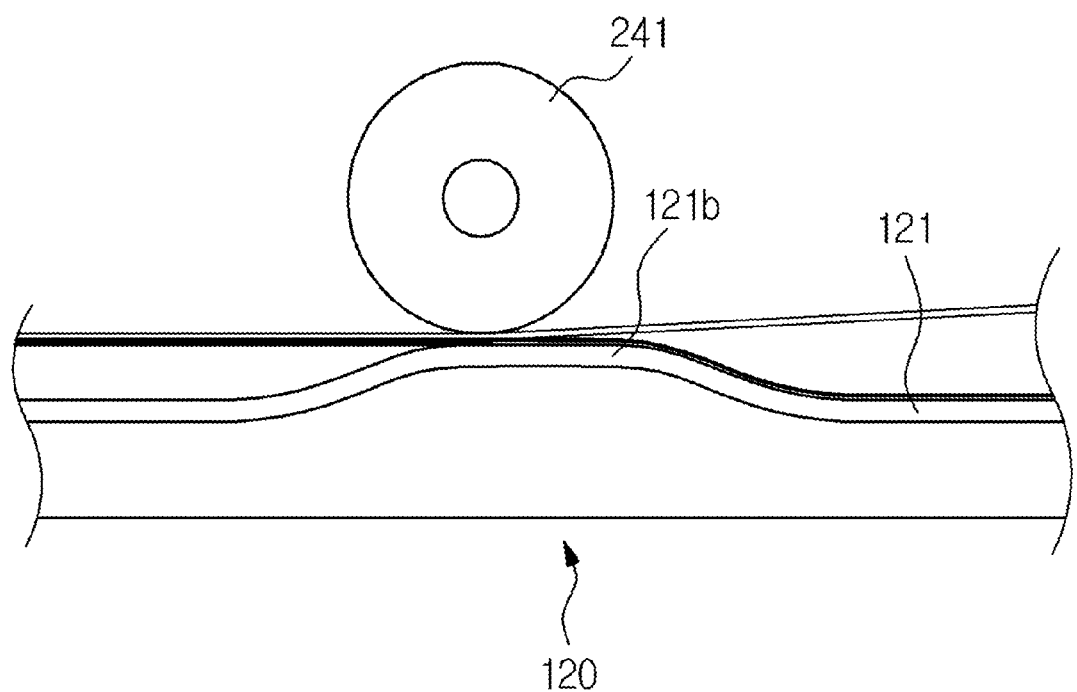
FIG. 10 is a schematic view illustrating a procedure of attaching a thin-film sheet to a protrusion via a roller of the hot stamping device according to the exemplary embodiment.
Figure 11:
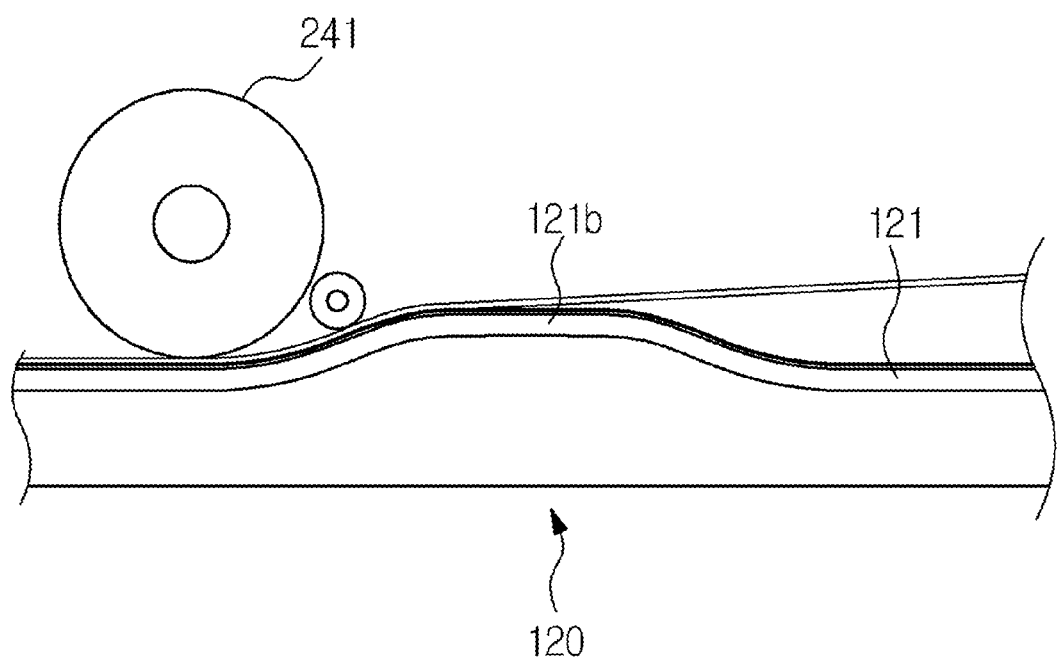
FIG. 11 is a schematic view illustrating a procedure of attaching a thin-film sheet to a protrusion via a roller of the hot stamping device according to an exemplary embodiment.

The side portion 121 located at the lower side of the four sides of the middle cover 120, as illustrated in FIG. 10, is provided with the protrusion 121b. In this case, it may be possible to accurately attach the thin film 123 to an inclined end of the protrusion 121b by reducing a movement speed of the hot stamping device 120. Alternatively, as illustrated in FIG. 11, when providing the hot stamping device 240 with an auxiliary roller 241, the inclined end of the protrusion 121b may be additionally pressed by the auxiliary roller 241, which may ensure that the thin film 123 is accurately attached to the inclined end of the protrusion 121b.

As described above, in the exemplary embodiment, although the middle cover 120 is separated from the jig device 210 after the thin film 123 is completely attached to one side portion 121 of the four side portions 121, and then is again fixed to the jig device 210 such that another side portion 121 faces upward, the disclosure is not limited thereto. Alternatively, the middle cover 120 may be rotated via rotation of the jig device 210 to allow the four side portions 121 of the middle cover 120 to be oriented so as to face upward in sequence. In this case, it may be desirable to vertically move the middle cover 120 as the jig device 210 is vertically moved based on the side portion 121 to which the thin film 123 will be attached because the middle cover 120 having a rectangular shape has different vertical and horizontal widths. That is, assuming that one of the left and right side portions 121 of the middle cover 120 is oriented to face upward, the jig device 210 is moved downward to move the middle cover 120 downward. Also, assuming that one of the upper and lower side portions 121 of the middle cover 120 is oriented to face upward, the jig device 210 is moved upward to move the middle cover 120 upward. In this way, even if any one of the four side portions 121 of the middle cover 120 is oriented to face upward, the corresponding side portion 121 may be located at the same height every time.

Although the sheet feed device 220 is adapted to apply tension to the sheet in the exemplary embodiment, the disclosure is not limited thereto. Alternatively, tension may be applied to the sheet by the sheet recovery device 230, or by both the sheet feed device 220 and the sheet recovery device 230.

Also, although the exemplary embodiment is applied to the display apparatus 100 including the middle cover 120 and the rear cover 130, the disclosure is not limited thereto, and may be directly applied to other kinds of covers including the side portion 121 to cover the side portion of the display panel 110.

As is apparent from the above description, a display apparatus according to the exemplary embodiments enables fabrication of a middle cover having various colors of side portions as a result of attaching a thin film having a particular color to the side portions of the middle cover that has been formed of the particular color of resin.

Although the exemplary embodiments have been shown and described, it would be appreciated by those skilled in the art that changes may be made in these exemplary embodiments without departing from the principles and spirit of the invention, the scope of which is defined in the claims and their equivalents.

What is claimed is:

1. A display apparatus comprising:
   a display panel on which an image is displayed, the display panel comprising an upper side surface, a lower side surface, a left side surface, and a right side surface;
   a cover comprising a side portion configured to cover the upper and the lower side surfaces and the left and the right side surfaces of the display panel; and
   a thin film attached to an outer surface of the side portion, wherein the side portion comprises a concavely stepped portion on at least one of a front end and a rear end of the outer surface thereof to limit an attachment area of the thin film.

2. The apparatus according to claim 1, wherein the cover further comprises:
   a middle cover having the side portion and a rear portion configured to cover an outer peripheral region of a rear surface of the display panel; and
   a rear cover coupled to the middle cover and configured to cover the rear surface of the display panel.

3. The apparatus according to claim 2, wherein the side portion is formed of a transparent material, and the rear portion is formed of an opaque material.

4. The apparatus according to claim 3, wherein the side portion and the rear portion are integrally formed with each other via double injection molding.

5. The apparatus according to claim 1, wherein the thin film is attached to the outer surface of the side portion via hot stamping.

6. A display apparatus comprising:
   a display panel on which an image is displayed, the display panel comprising an upper surface, a lower surface, a left surface, and a right surface;
   a rear housing disposed behind the display panel; and
   a bezel which is disposed around the display panel, the bezel comprising a side wall which covers at least a portion of at least one from among the upper, the lower, the left, and the right surfaces of the display panel,
   wherein a thin film is attached to an outer surface of the side wall and the side wall is of one color and the thin film is of another color,
   wherein the side wall comprises a concavely stepped portion on at least one of a front end and a rear end of the outer surface thereof to limit an attachment area of the thin film.

7. The display apparatus of claim 6, wherein the bezel is a front bezel and the front bezel further comprises a front plate disposed in front of the display panel, and the side wall extends rearwardly from the front plate.

8. A display apparatus comprising:
   a display panel on which an image is displayed; and
   a cover configured to mount the display panel,
   wherein the cover comprises:
      a first portion to cover a side part of the display panel,
      a second portion configured to be concavely stepped with respect to an outer surface of the first portion, and
      a thin film attached to an outer surface of the first portion aside from the second portion.

9. The display apparatus according to claim 8, wherein the thin film is attached to the outer surface of the first portion via hot stamping.

10. The display apparatus according to claim 8, wherein an attachment area of the thin film is limited by the second portion.

* * * * *